United States Patent [19]

Mizukami et al.

[11] Patent Number: 5,111,080
[45] Date of Patent: May 5, 1992

[54] COMPLEMENTARY SIGNAL TRANSMISSION CIRCUIT WITH IMPEDANCE MATCHING CIRCUITRY

[75] Inventors: Masao Mizukami, Yokohama; Yoichi Sato, Iruma, both of Japan

[73] Assignees: Hitachi, Ltd.; Hitachi VLSI Engineering Corp., both of Tokyo, Japan

[21] Appl. No.: 614,071

[22] Filed: Nov. 13, 1990

[30] Foreign Application Priority Data

Nov. 21, 1989 [JP] Japan .................................. 1-302515

[51] Int. Cl.⁵ ........................................ H03K 19/0175
[52] U.S. Cl. ........................................ 307/475; 333/32
[58] Field of Search ..................... 307/443, 475, 448; 333/32, 33

[56] References Cited

U.S. PATENT DOCUMENTS

| | | | |
|---|---|---|---|
| 4,495,626 | 1/1985 | Brunin et al. | 307/443 |
| 4,859,877 | 9/1989 | Cooperman et al. | 307/443 |
| 4,985,674 | 1/1991 | Woods et al. | 307/475 |
| 5,013,937 | 5/1991 | Aoki | 307/475 |
| 5,045,730 | 9/1991 | Cooperman et al. | 307/475 |

FOREIGN PATENT DOCUMENTS 2537383 2/1977 Fed. Rep. of Germany ...... 307/443
2708671 11/1978 Fed. Rep. of Germany ...... 307/443

OTHER PUBLICATIONS

Leon et al., IBM Technical Disclosure, vol. 12 #8, Jan. 1970.
CICC (Custom Integrated Circuit Conference), May, 1989, pp. 10.7.1–10.7.4.
ICCD (International Conference on Computer Devices), Oct. 3–5, 1988, pp. 344–347.

Primary Examiner—David Hudspeth
Assistant Examiner—Andrew Sanders
Attorney, Agent, or Firm—Fay, Sharpe, Beall, Fagan, Minnich & McKee

[57] ABSTRACT

A signal transmission circuit in which a signal is converted into two complementary signals which are outputted from a signal transmission circuit via series resistors. The amplitude of each of the complimentary signals is reduced by the series resistors and terminating resistors provided on a signal receiving side. The signal receiving side shifts the level of the signals which it inputs. The level shifted signals are amplified by a high-input impedance differential amplifying circuit.

24 Claims, 4 Drawing Sheets

COMPLEMENTARY SIGNAL TRANSMISSION CIRCUIT WITH IMPEDANCE MATCHING CIRCUITRY

BACKGROUND OF THE INVENTION

1) Field of the Invention

The present invention relates to a signal transmission system and circuits therefor, and to an effective technique available in a signal transmission system and circuits therefor both of which perform the electrical connection between digital signal processing apparatus comprised of, for example, a CMOS (complementary Metal Oxide Semiconductor) or the like or between functional blocks thereof.

2) Description of the Related Art

As a system for performing the signal transmission at high speed between digital circuits made up of semiconductor integrated circuit devices, may be mentioned an ECL (Emitter-Coupled Logic) type interface system for transmitting a signal having small amplitude of 0.8 V or so. As an example of transmitting the signal having such small amplitude using CMOS circuits, there is known a technique described in the paper "CICC (Custom Integrated Circuit Conference)", p.p. 10.7.1–10.7.4, May 1989. Even in the case of the system for transmitting the signal having small amplitude, similar to the above one, there is also known a transmission system free of use of ECL level. As such an example, there is known a technique described in the paper "ICCD (International Conference On Computer Devices)", p.p. 344–347, Oct. 3–5, 1988.

An approach for rendering the processing operation of a CMOS circuit high-speed and bringing the CMOS circuit into high integration has been performed with advancement in a fine processing technique of semiconductor devices. With this practice, high performance has been achieved inside a semiconductor chip. However, an approach for rendering, high-speed, the signal processing of transmission circuits for performing the electrical connection between digital apparatus made up of semiconductor integrated circuit devices or between functional blocks thereof still remains backward. This is attributed to the fact that the current drive ability of the CMOS circuit is low and a signal-transfer delay time substantially becomes larger at a position where the capacitive load of the circuit is increased. Accordingly, a digital integrated circuit using a CMOS circuit has generally adopted a method for disposing bipolar ICs having large drive ability around the digital integrated circuit to thereby transmit signals to cables (transmission lines) by way of the bipolar ICs.

SUMMARY OF THE INVENTION

It has been definitely shown by the investigation of the present inventors that such an arrangement referred to above increases the number of components and needs to have a plurality of kinds of power supplies, thereby causing an increase in the manufacturing cost.

It has further been made clear by the investigation of the present inventors that the CMOS circuit of the above ECL interface system without such external bipolar ICs becomes complex due to the practice of changing the level of the CMOS to the ECL level, and an accurate reference voltage is required. In an approach for transmitting a differentiated wave of an output signal from the circuit referred to above in the form of small-amplitude, a source voltage VDD/2 of one-half the operation voltage VDD is required. Namely, when the voltage VDD/2 is produced by a voltage divider circuit to connect terminating resistors having small resistance values to both ends of transmission lines, a large d.c. current flows into the terminating resistors. Accordingly, it has been definitely shown by the investigation of the present inventors that a low output-impedance type power circuit for forming or producing the above voltage should be provided separately.

It is an object of the present invention to provide a signal transmission system capable of realizing signal high-speed transmission by a simple construction, and circuits therefor.

It is another object of the present invention to provide a signal transmission system capable of realizing signal high-speed transmission while rendering the power consumption low, and circuits therefor.

The above and other objects, novel features and advantages of the present invention will become apparent from the following description and the appended claims, taken in conjunction with the accompanying drawings.

A brief description will now be made of a typical one of the inventions disclosed in the present application. Complementary signals to be transmitted are outputted from a transmission side via series resistors. Then, the amplitude of each of the signals to be transmitted is reduced by the series resistors and terminating resistors on a receiving side. In addition, the input signals each having the reduced amplitude are amplified by a differential amplifying circuit having the high input impedance provided on the receiving side. Then, resistors are provided so as to be connected in series to output terminals, respectively, of a transmission-side output circuit for outputting complementary output signals therefrom in response to the signals to be transmitted. Further, the terminating resistors whose resistances are matched with the characteristic impedance are provided at terminals of transmission lines for transmitting the above output signals, and the high-input impedance type differential amplifying circuit for receiving the transmitted signals is disposed in a receiving-side circuit.

According to the above-described means, since the level of each of the signals transmitted to the transmission lines is brought into small amplitude by the resistive voltage division using the series resistors on the transmission side and the terminating resistors on the receiving side and the signals each having the amplitude thus reduced are transmitted to the receiving side, the signal transmission can be performed at high speed even in the case of the CMOS circuit having small current drive ability alone. In addition, since noise enters, in a common mode, the transmission lines of a twisted pair for transmitting the complementary signals, it can be canceled by the differential amplifying circuit on the receiving side.

DETAILED DESCRIPTION OF THE PREFERRED EMBODIMENTS

Figure 6:
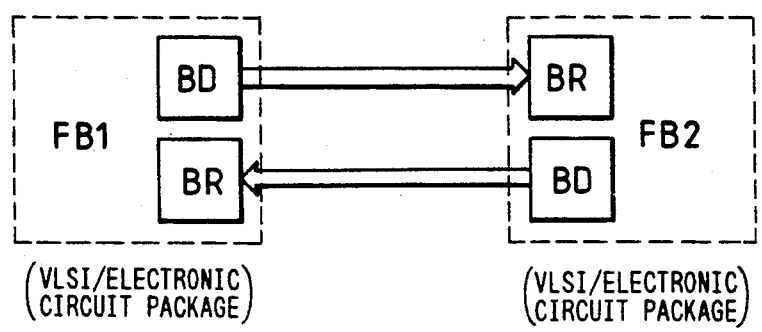
FIG. 6 is a basic block diagram showing one embodiment of a digital signal processing apparatus in which a signal transmission system according to the present invention is employed.

FIG. 6 shows a basic block diagram of one embodiment depicting a digital signal processing apparatus in which a signal transmission system according to this invention is employed.

The digital signal processing apparatus according to the present embodiment comprises two functional blocks, i.e., FB1 and FB2. In order to perform digital signal processing a signal transfer is mutually effected between the functional blocks FB1 and FB2. For the purpose of the signal mutual transfer, the functional blocks FB1 and FB2 are provided with a signal transmission circuit (driver) BD and a signal receiving circuit (receiver) BR, respectively. The signal transmission circuit BD and the signal receiving circuit BR are connected to each other by signal transmission lines in a state in which they are associated with each other. The signal transmission lines are provided according to a plurality of signals to be transmitted. The signal transmission circuit and the signal receiving circuit are made up of unit circuits for the signal transmission/reception according to the signals, respectively. The above-described functional blocks FB1 and FB2 comprise respectively electronic circuit packages of the type that semiconductor integrated circuit devices like VLSIs are mounted one or plural pieces on packaged or mounting substrates such as printed boards.

Figure 1:
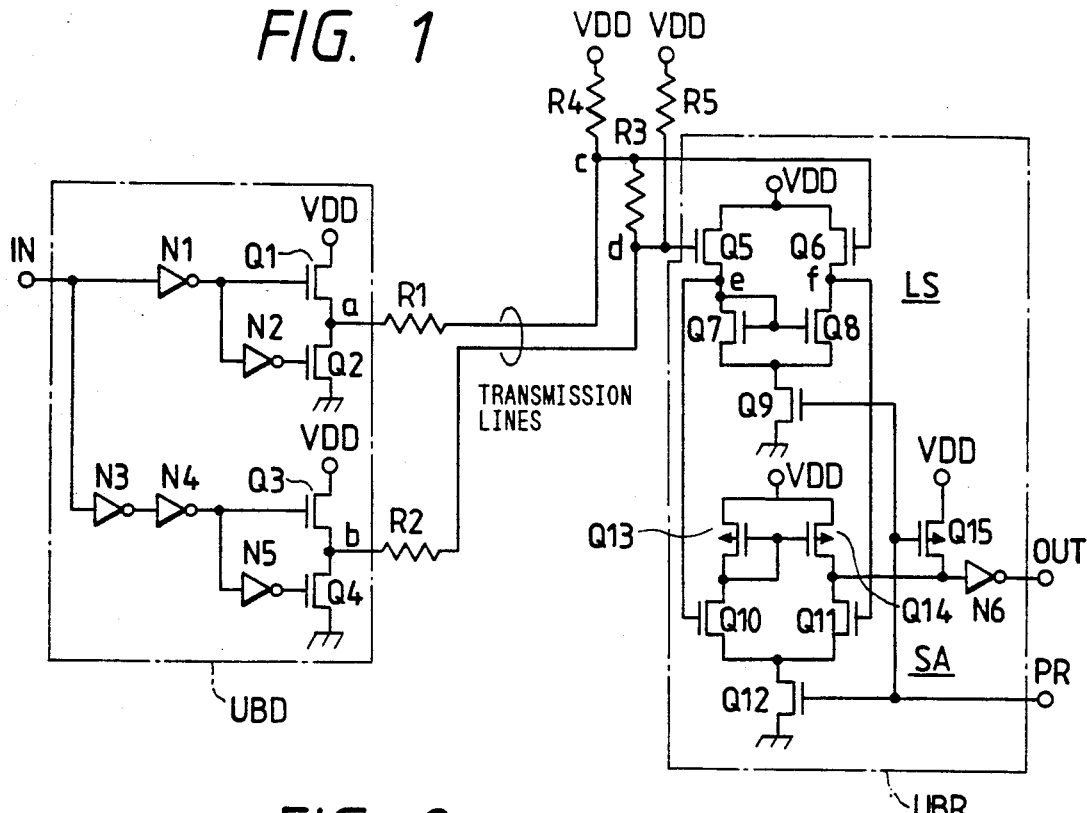
FIG. 1 is a circuit diagram showing one embodiment of each unit circuit comprising a pair of a signal transmission circuit and a signal receiving circuit, which are employed in a digital signal processing apparatus to which the present invention is applied.

FIG. 1 shows a circuit diagram of one embodiment depicting unit circuits each comprising a pair of signal transmission circuit (driver) BD and a signal receiving circuit (receiver) BR which are employed in the above digital signal processing apparatus.

A unit circuit UBD provided on a transmission side is made up of the following circuits. The unit circuit UBD receives an input signal IN to be transmitted, which is formed or produced by an unillustrated inner circuit, and produces a complementary output signal according to the input signal IN. Thus, the input signal IN is inputted to inverter circuits N1 and N2, and to an inverted push-pull output circuit comprising N-channel type MOSFETs Q1 and Q2 of the push-pull type. More specifically, an output signal from the inverter circuit N1 is supplied to the output MOSFET Q1 provided on the side of a source voltage VDD. In addition, this output signal is inverted by the inverter circuit N2 to be supplied to the gate of the output MOSFET Q2 provided on the ground potential side. Thus, when the output signal of the inverter circuit N1 is high in level, the output MOSFET Q1 is turned on in response to that output signal. The high level of the output signal from the inverter circuit N1 is inverted by the inverter circuit N2 to be rendered low in level. As a consequence, the output MOSFET Q2 is turned off in response to the output signal from the inverter circuit N2. In addition, when the output signal of the inverter circuit N1 is low in level, the output MOSFET Q1 is turned off in response to its output signal. The low level of the output signal from the inverter circuit N1 is inverted by the inverter circuit N2 to be high in level. Therefore, the output MOSFET Q2 is turned on in response to the output signal of high level from the inverter circuit N2. In this way, the output MOSFETs Q1 and Q2 are complementarily turned on or off according to the output signal of the inverter circuit N1, so that the output signal having high or low level is produced from an output terminal a.

In order to produce a complementary output signal b corresponding to the output signal a from the inverted push-pull output circuit including the above output MOSFETs Q1 and Q2, the above input signal IN is inverted by the inverter circuit N3. The signal thus inverted is applied to inverter circuits N4, N5, and an inverted push-pull output circuit similar to the above one, which comprises N channel type MOSFETs Q3 and Q4 of the push-pull type. This type of inverted push-pull output circuit has an input portion thereof into which the inverter circuit N3 for inverting the input signal IN is inserted. The insertion of this inverter circuit N3 therein thus permits formation of the output signal b from the output circuit complementary to the output circuit used to produce the output signal a.

Resistors R1 and R2 are connected in series to output terminals of a pair of output circuits, respectively, of the unit circuit UBD provided on the transmission side. The output signals to be transmitted are delivered to a pair of transmission lines via the resistors R1, R2 connected in series thereto. The resistors R1 and R2 are set to have resistance values sufficiently larger than those of terminating resistors of a pair of transmission lines to be described later.

In the same drawing, the transmission lines are represented by plotting a pair of lines in parallel. However, it comprises conductors of a twisted pair which have widely been used for the electrical connection between or among electronic circuit packages in practical use.

Provided on the side of input terminals of a unit circuit UBR on a termination side of the above transmission lines, i.e., on a signal receiving side are terminating resistors of R3 to R5 whose resistances are equal to or matched with the characteristic impedances of the transmission lines. The present embodiment utilizes a Δ connection-type termination circuit comprising terminating resistors R4, R5 provided between both signal transmission lines and the source voltage VDDs and a resistor R3 provided between both signal transmission lines.

Signals c and d transmitted through the transmission lines to the receiving side are subjected to the voltage or potential division and hence have small amplitudes. Described strictly, the levels of the signals c and d are determined by the conductances of the output MOSFET Q1 through MOSFET Q4 in the output circuit and distributed resistance values of the transmission lines. However, since these resistance values are low as compared with those of the series resistors R1, R2 and the terminating resistors R3 through R5, it is not too much to say that the levels of the signals c and d are substantially determined by the ratio of the resistors R1, R2 to the terminating resistors R3 through R5.

The unit circuit on the receiving side, which is used to receive the above-described transmission signals having small amplitude, utilizes a level shifting circuit LS having high input impedances and a differential amplifying circuit SA having high sensitivity. The level shifting circuit LS comprises a load circuit composed of N-channel type MOSFETs Q5 and Q6 used to receive the signals d and c respectively; and N-channel type MOSFETs Q7 and Q8 of the current-mirror type provided on the source side of the MOSFETs Q5 and Q6. The drains of the input MOSFETs Q5 and Q6 of the level shifting circuit LS are connected to the source voltage VDD. The sources of the current-mirror type N-channel MOSFETs Q7 and Q8 of the load circuit are subjected to the ground potential of the circuit via a N-channel type switch MOSFET Q9 to render the power of the circuit low. As described above, the level shifting circuit disposed in the input portion of the unit circuit on the receiving side has been set to be a high input impedance because the impedance matching of the transmission lines is intended to be effected only by the terminating resistors. Namely, such a measure is taken because the impedance matching at the terminals of the transmission lines becomes hard if the input impedance on the side of the receiving circuit is maintained at a predetermined value. The level shifting circuit is included because the level of each of the input signals c and d, which is brought into the small amplitude by the resistive potential division as described above, is substantially biased toward the source voltage VDD, so that the differential amplifying circuit SA cannot directly perform its amplifying operation. In other words, the level shifting circuit LS is adapted to effect the amplifying operation of the input signals c and d biased toward the source voltage VDD at a region representing the highest sensitivity of the differential amplifying circuit SA to be described in the following.

The differential amplifying circuit SA comprises a pair of N-channel type differential MOSFETs Q10 and Q11 whose gates are supplied with complementary input signals e and f which have been subjected to the level shifting of the level shifting circuit LS, an active load circuit connected to the drains of the MOSFETs Q10 and Q11 and comprising current-mirror type P-channel MOSFETs Q13 and Q14, a N-channel type power switch MOSFET Q12 connected to the sources of the differential amplifying MOSFETs Q10 and Q11.

Although a particular limitation is given, the power switch MOSFET Q9 of the level shifting circuit LS and the power switch MOSFET Q12 of the differential amplifying circuit SA are turned on when the unit circuit UBR on the receiving side is in an operated state by a switch control signal PR, thus rendering the respective circuits active. If the control signal PR is not supplied when the unit circuit UBR is rendered inactive, the level shifting circuit LS and the differential amplifying circuit SA can serve to prevent a stationary d.c. current from flowing.

The output signal of the differential amplifying circuit SA is delivered to an inner circuit via an inverter circuit N6. As described above, with a view toward preventing the input signal of the inverter circuit N6 from being rendered indefinite in level owing to the fact that the control signal PR is rendered low in level and the differential amplifying circuit SA is brought into an inactive state, a P-channel type pull-up MOSFET Q15 used to receive the control signal PR is provided between an input terminal of the inverter circuit N6 and the source voltage VDD. Thus, when the control signal PR is in a low level, the P-channel type MOSFET Q15 is turned on, so that the input signal of the inverter circuit N6 can be fixed to a high level like the level of the source voltage VDD. It is therefore possible to prevent a d.c. current from flowing into the inverter circuit N6 due to the fact that the input signal of the inverter circuit N6 is brought into an indefinite level.

Incidentally, the VLSIs formed with the unit circuits UBD and UDR are comprised of CMOS circuits in the present embodiment. Therefore, the above inverter circuits N1 through N6 are made up of CMOS inverter circuits. The push-pull output circuit is constructed using the N-channel type MOSFETs Q1 and Q2 or the like in the present embodiment, in spite of the fact that the VLSI formed with the unit circuit UDB is comprised of the CMOS circuit. This reason is that since the input signals are subjected to the potential division by means of the series resistors provided at the output portions and the terminating resistors and then delivered to the receiving side, the high level like a CMOS level is not required and the construction of the output circuit only by the N-channel type MOSFETs rather than the construction by different ones permits high integration of the output circuit.

Figure 2:
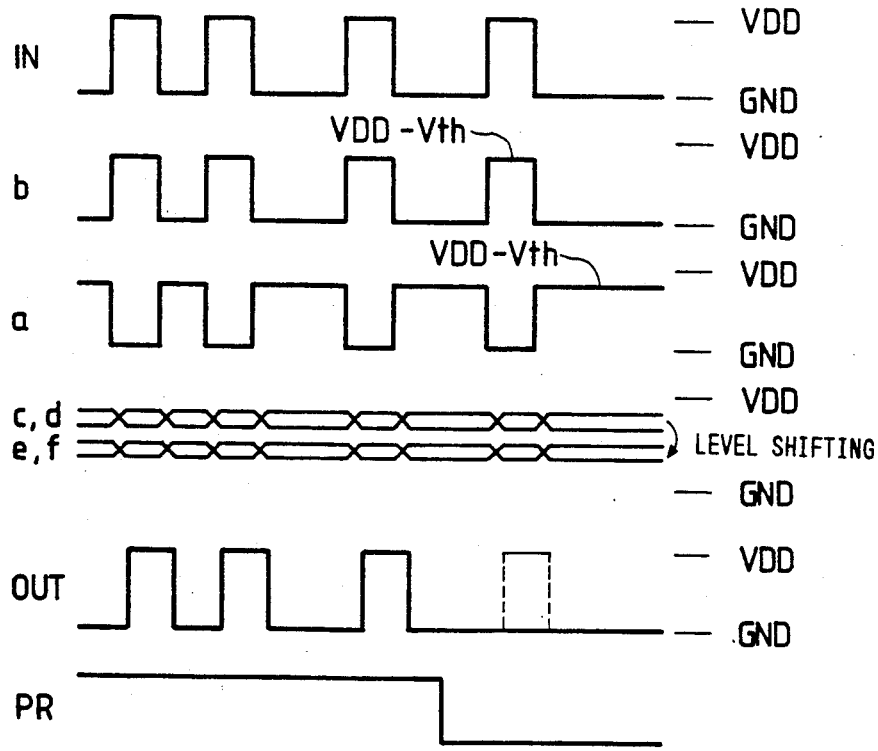
FIG. 2 is waveforms for describing one example of the operation of the embodiment.

FIG. 2 shows waveforms for describing the operation of the circuit of the embodiment shown in FIG. 1.

Since the VLSIs are constructed of internally-provided CMOS circuits, the input signal IN is brought into signal amplitude in the form of a full swing, which has the high level like the level of the source voltage VDD and the low level like the level of the circuit ground potential.

Since the inverted push-pull output circuit is made up of the N-channel MOSFETs as described above, the high level of each of the complementary output signals a and b is brought into a high level like the level of VDD-Vth (Vth corresponds to the threshold voltage of each of the output MOSFETs Q1 and Q2), whereas the low level thereof is brought into a low level substantially equal to the level of the circuit ground potential. When the VDD is set to about 5 V, the threshold voltage Vth, in which the body effect is taken into consideration, substantially becomes about 1.5 V or so. Accordingly, the above VDD-Vth is set to a voltage of about 3.5 V or so.

On the other hand, the input signals c and d delivered through the transmission lines are brought into complementary signals having small amplitude, which are subjected to the potential division by the resistors R1, R2 and the terminating resistors of R3 through R5 where the distributed resistance values of the signal transmission lines are neglected. When the resistance value of the terminating resistor R4 or the like is set to 100Ω and the resistance value of the resistor R1 corresponding to the resistor R4 is set to 900Ω, for example, the amplitude of each of the signals c ad d is brought into small amplitude of the order of 300 mV–400 mV. Therefore, since the signals each having the above-described signal amplitude are merely transmitted even when the above-described simple output circuit using the MOSFETs is employed, relatively large parasitic capacitors can be charged or discharged at high speed even in the case where the transmission lines have the parasitic capacitors. As a result, the high-speed signal transmission can be effected.

Since the signal transmission is performed in a state in which the terminating resistors are provided on the transmission lines thereby to be matched with the characteristic impedances of the transmission lines in the present embodiment, there is no possibility of producing noise such as reflection caused by the impedance mismatching on the transmission lines. In addition, the present embodiment adopts a system of the type that the conductors of the twisted pair are used to transmit the complementary signals. Therefore, the coupling noise, which appears on or enters the transmission lines is represented in form of the common mode can be canceled by the amplifying operation of the differential amplifying circuit provided on the signal receiving side. As a consequence, the above-described simple construction permits high-speed and steady transmission of the signals having small amplitude.

When a high-frequency signal is delivered to transmission lines, the provision of the terminating resistors is indispensable to matching with the characteristic impedances of the transmission lines. However, the characteristic impedances of the above-described twisted pair conductors are relatively small and hence the resistance values of the terminating resistors become small correspondingly. Therefore, the mere provision of the terminating resistors on the transmission lines needs to cause drive current having a large current value to flow in the signal transmission lines. Let's describe such a case, using the above embodiment by way of example. In this case, where it is desired to set the resistance values of the terminating resistors to 10Ω and transmit a signal having signal amplitude of 5 V, large drive current of 50 mA or greater should be caused to flow in the transmission lines.

When a bipolar IC is employed as in the conventional example, the flowing of the above drive current in the transmission lines offers no problem in particular. However, when the CMOS circuits are employed, it is next to impossible to cause such large current to flow in the transmission lines. On the other hand, the present embodiment is so constructed that the series resistors are inserted into the output portion provided on the signal transmission side, thereby attenuating the amplitude of the signal to be transmitted, as described above. Thus, when the resistor of 900Ω is inserted therein as in the previous embodiment, the current which flows into the transmission lines can be rendered as small as 5 mA. As a consequence, a plurality of output circuits can be formed in one semiconductor integrated circuit device. Namely, the signal transmission system and its circuit employed in the present embodiment permit the achievement of low power consumption of the circuit as well as the high-speed transmission described above.

As described above, where the amplitude of the signal is reduced by the series resistors provided at the output portion on the signal transmission side and the terminating resistors on the signal receiving side, the input signals c and d are biased in level toward the source voltage VDD side at which the terminating resistors are provided. If the signals c and d remain level-biased toward the source voltage VDD side in this way, the differential amplifying circuit cannot perform the amplifying operation of the signals. Therefore, the signals are level-shifted by the level shifting circuit LS using the source follower MOSFETs Q5 and Q6. Namely, the signals c and d are level-shifted so as to be level-shifted signals e an f by substantial threshold voltages of the MOSFETs Q5 and Q6.

The differential amplifying circuit SA serves to amplify the complementary signals e and f thus level-shifted to thereby deliver the amplified signals to the inverter circuit N6. As a consequence, the output signal OUT of the inverter circuit N6 represents a signal of the CMOS levels comprising the high level like the level of the source voltage VDD and the low level like the level of the circuit ground potential.

When the control signal PR is rendered low in level in the present embodiment, the level shifting circuit LS and the differential amplifying circuit SA are brought into an inactive state, and the input signal of the inverter circuit N6 is fixed to a high level according to an on-state of the MOSFET Q15, thus producing an output signal OUT of the low level. As a consequence, transmission signals on the transmission side can be canceled on the signal receiving side in spite of the fact that the signals are continuously transmitted from the transmission side.

Figure 3:
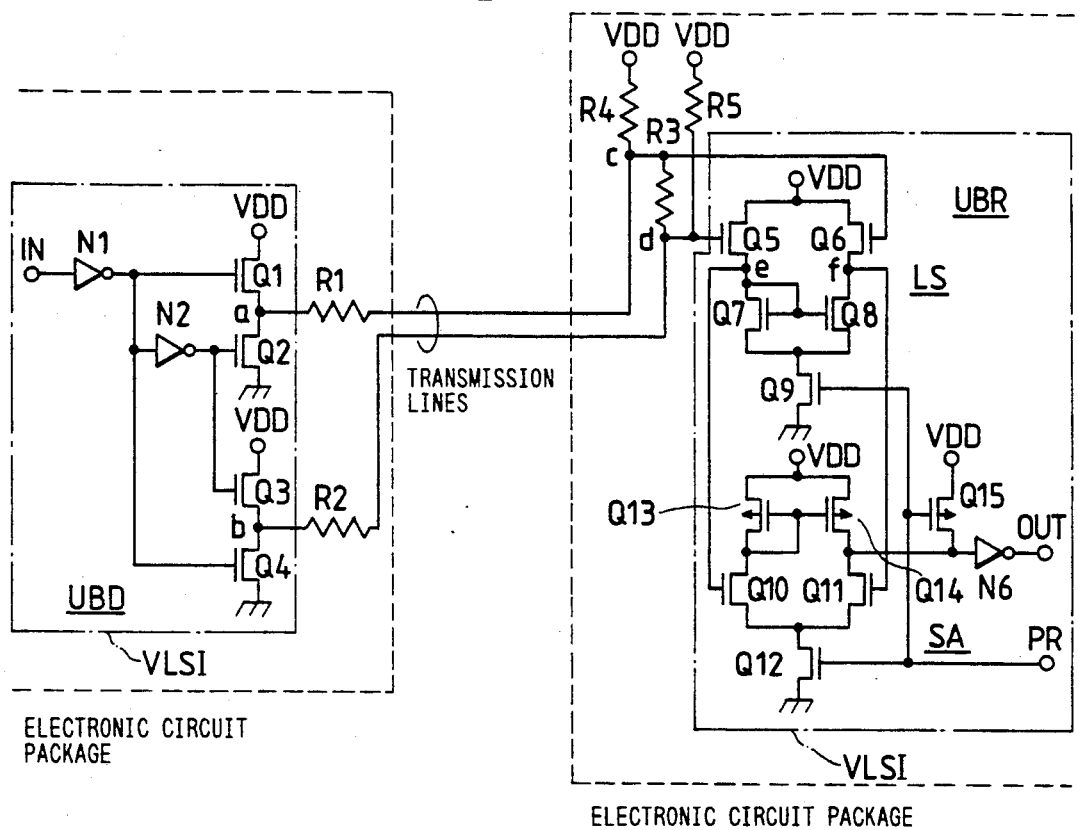
FIG. 3 is a circuit diagram depicting another embodiment of each unit circuit comprising a pair of a signal transmission circuit and a signal receiving circuit which are employed in the digital signal processing apparatus to which the present invention is applied.

FIG. 3 is a circuit diagram showing another embodiment of unit circuits UBD, UDR each comprising a pair of a signal-transmission circuit BD and a signal receiving circuit BR, which are employed in the above digital signal processing apparatus.

In the present embodiment, a digital circuit including the unit circuit UBD provided on the signal transmission side comprises a semiconductor integrated circuit device VLSI indicated by the alternate long and short dash line. This VLSI is enclosed in an electronic circuit package such as a printed board indicated by the broken line. The above resistors R1, R2 are also mounted in the electronic circuit package. Namely, the resistors R1, R2 for the semiconductor integrated circuit device VLSI are provided as external parts. The resistance values of the above terminating resistors R3 through R5 have small allowable range for matching the resistance values with the characteristic impedances of the transmission lines. Internal resistors provided inside the semiconductor integrated circuit device have large variations in their resistance valued due to the manufacturing process, and hence these resistors are unsuitable for the use of the impedance matching. Therefore, the terminating resistors R3 through R5 provided on the signal receiving side are mounted in an electronic circuit package as external parts for the semiconductor integrated circuit device VLSI formed with the unit circuit UBR. The amplitude of each of signals to be transmitted is determined by the resistance ratio of the series resistors to the terminating resistors as described above. Therefore, inconvenience arises in that when the resistors R1, R2 provided on the signal transmission side are incorporated into the VLSI, the amplitude of each signal to be transmitted is affected by variations in the process, thereby causing a substantial change in the amplitude thereof. For such a reason, the resistors R1, R2 are provided on a mounting substrate of the electronic circuit package as described above. Accordingly, it is needless to say that if the resistance values of the resistance elements mounted in the semiconductor integrated circuit device can be set with high accuracy, these resistance elements may also be incorporated into the semiconductor integrated circuit device. The above process is similar to that in the embodiment shown in FIG. 1.

In this embodiment, the unit circuit UBD on the signal transmission side makes use of the output signals from the inverter circuits N1, N2 in the inverted push-pull output circuit for outputting or producing the output signal a, as the input signal supplied to the gates of the push-pull output MOSFETs Q3, Q4 for producing the output signal b in order to simplify the circuit UBD. Namely, the output signal b may be reversed in phase with respect to the output signal a, the output signal of the inverter circuit N2 is therefore supplied to the gate of the output MOSFET Q3 for producing the output signal b provided on the source voltage side, in common with the gate of the output MOSFET Q2 for producing the output signal a provided on the ground potential side. In addition, the output signal of the inverter circuit N1 is supplied to the gate of the output MOSFET Q4 for forming the output signal b provided on the ground potential side, in common with the gate of the output MOSFET Q1 for forming the output signal a provided on the source voltage side. With this arrangement, the previous inverter circuits N3 through N5 can be omitted, and the signal transmission rate can be rendered faster correspondingly.

Figure 4:
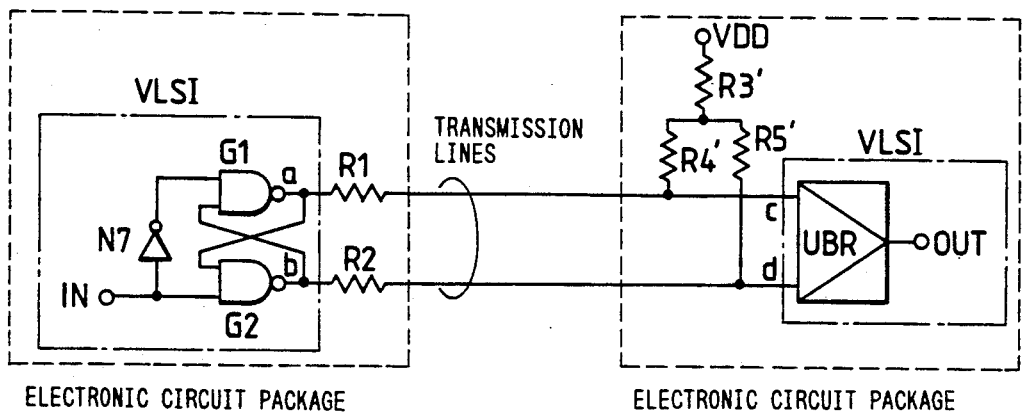
FIG. 4 is a circuit diagram illustrating a further embodiment of each unit circuit comprising a pair of a signal transmission circuit and a signal receiving circuit which are employed in the digital signal processing apparatus to which the present invention is applied.

FIG. 4 is a circuit diagram showing a further embodiment of unit circuits UBD and UDR each comprising a pair of a signal transmission circuit BD and a signal receiving circuit BR which are employed in the digital signal processing apparatus.

In the present embodiment, complementary output signals a and b are produced by a latch circuit making use of NAND circuits G1, G2, as the unit circuit UBR provided on the signal transmission side. More specifically, an input signal IN and a signal inverted by an inverter circuit N7 are supplied to two inputs of the latch circuit, thus producing the output signals a and b which complementarily varies with the input signal IN. In the present embodiment, the rate of the complementary change in the output signals a and b can be rendered high by making use of positive operation of the latch circuit.

The terminating resistors connected to the transmission lines, which are provided on the signal receiving side, comprise resistors R4', R5' whose one ends are connected to the terminals of the paired line, and a resistor R3' provided between the other ends common to the resistors R4' and R5' and the source voltage VDD. Namely, the terminating resistors of R3' to R5' employed in the present embodiment are star-connected.

The other construction is similar to that in the embodiments shown in FIGS. 1 through 3. For example, the unit circuit URR on the signal receiving side, which is formed by a black box, structurally comprises the level shifting circuit LS, the differential amplifying circuit SA, the output inverter circuits, etc. as in the previous embodiment.

Since the above circuits are structurally simple and have low power consumption, the unit circuits UBD and UBR employed in the above-described respective embodiments can make use of input/output interface circuits used with the gate arrays, standard cells, etc., the interface circuit being employed in a so-called ASIC (Application Specific Integrated Circuit), for example. It is therefore easy to design and fabricate the semiconductor integrated circuit device VLSI in which the signal transmission circuit and the signal receiving circuit are mounted.

Figure 7:
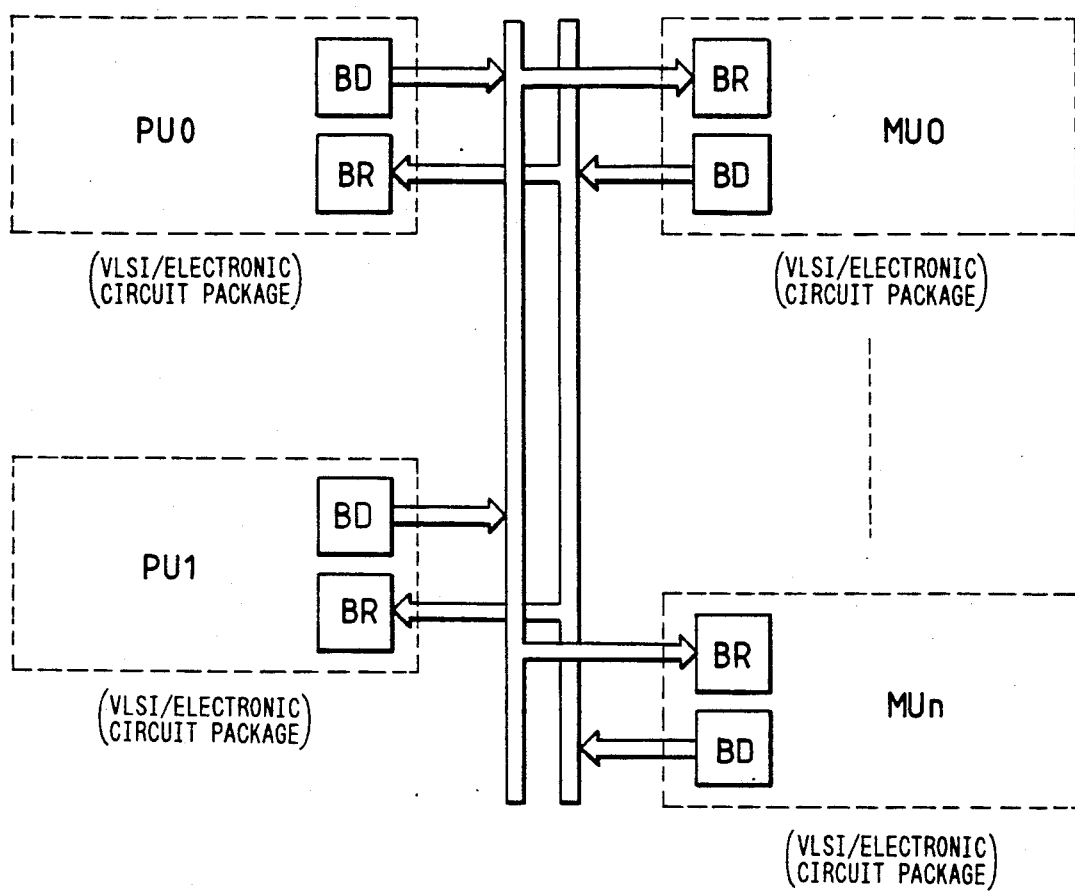
FIG. 7 is a block diagram depicting another embodiment of a digital signal processing apparatus in which the signal transmission system according to the present invention is employed.

FIG. 7 shows a block diagram of another embodiment of a digital signal processing apparatus to which a signal transmission system according to the present invention is applied.

The digital signal processing apparatus employed in the present embodiment is not constructed such that the functional blocks used to perform the signal transmission as described in the previous embodiment are provided in the form of a 1:1 correspondence. This apparatus is so constructed that the signal transmission is mutually and selectively effected among a plurality of functional blocks. More specifically, the transmission lines comprise two buses BUSA and BUSB. The bus BUSA serves to supply signals outputted at time intervals and alternatively from signal transmission circuits BD of processor units PU0 and PU1 to signal receiving circuits BR of a plurality of memory units of MU0 to MUn. Although not limited in particular, the memory units of MU0 to MUn serve to receive only one signal selected from a desired signal transmission circuit BD and transmitted through the bus BUSB. The bus BUSB serves to supply a signal outputted at time intervals and alternatively from the signal transmission circuits BD of the memory units of MU0 to MUn to the signal receiving circuit BR of either one of the processor units of PU0 and PU1.

The digital processing apparatus employed in the present embodiment performs the transfer of the signals between processors and memories through the bus arrangement or system as in a microcomputer of the board system. Described specifically, the processor units PU0, PU1 and the memory units of MU0 to MUn as functional blocks comprise the semiconductor integrated circuit devices VLSIs for constituting microprocessors and memories, and electronic circuit packages comprised of substrates used to mount the VLSIs thereon or the like. The buses BUSA and BUSB as the transmission lines are made up of conductors of a twisted pair or the like corresponding to the number of their signals.

Figure 5:
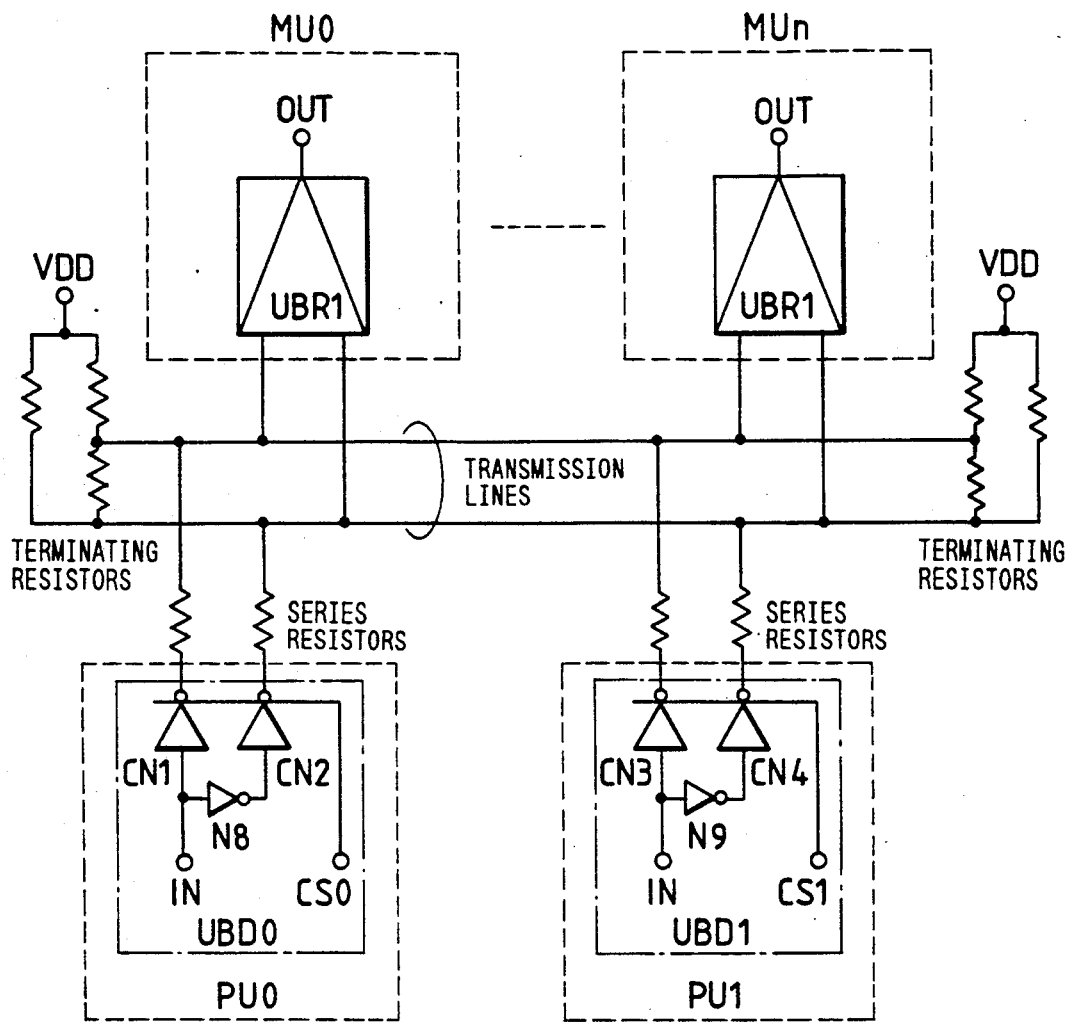
FIG. 5 is a circuit diagram showing one embodiment of a transmit-receive circuit which pays attention to one commonly-used signal transmission line employed in a digital signal processing apparatus according to another embodiment to which the present invention is applied.

FIG. 5 shows a circuit diagram of one embodiment in which one signal transmission line employed in a digital signal processing apparatus shown in FIG. 7 is taken into consideration.

In order to adopt the above-described bus arrangement, unit circuits UBD0, UBD1 corresponding to the processor units PU0, PU1, respectively, provided as the transmission side and unit circuits of UBR0 to UBRn corresponding to the memory units of MU0 to MUn, respectively, are suitably connected to intermediate points of a pair of transmission lines. As described above, since the transmission lines have no special transmitting terminals and receiving terminals from a hardware point of view, terminating resistors are connected to both ends of the transmission lines, respectively. These terminating resistors are provided on mounting substrates in units of functional blocks positioned and provided at both ends of the signal transmission lines in a hardware fashion.

When the bus system is adopted as described above, the common transmission lines are time-divisionally used and the signal transmission is effected. For this purpose, the unit circuits UBD0 and UBD1 for the signal transmission circuits are constructed so as to have tristate output functions. The unit circuit UBD0 makes use of output circuits CN1 and CN2 of the clocked-inverter type. A selection signal CS0 is then supplied to clock terminals of the output circuits CN1 and CN2, so that the operation as a tristate buffer is performed. When the processor unit PU0 acquires a bus available right and the signal transmission is carried out, the output circuits CN1 and CN2 are rendered active by a signal CS0. In addition, an input signal IN is applied to the output circuit CN1 and an input signal inverted by an inverter circuit N8 is supplied to the output circuit CN2, thus producing a pair of complementary output signals. At this time, the other processor unit PU1 is activated such that the output circuits CN3 and CN4 of the unit PU1 are rendered inactive by a signal CS1, in other words, they are brought into an output high-impedance state.

When the memory unit MU0 is selected and receives a signal from the processor unit PU0, the unit circuit UBR0 of the memory unit MU0 is brought into an active state by such a control signal PR as referred to above. As a consequence, the signal transmission similar to the above is effected. At this time, the reflection of signals from the ends of the transmission lines to which the memory unit MUn or the like is connected does not develop when the signal transmission is performed between the processor unit PU0 and the memory unit MU0, because the terminating resistors whose resistances are matched to the characteristic impedance are provided at both ends of the transmission lines. Incidentally, where such terminating resistors are disposed in both ends of the transmission lines, the signal transmission circuit needs to have the drive ability of twice the original ability. It is therefore necessary to enhance the drive ability of the output circuits of CN1 to CN4 sufficiently as compared with the case where the signal transmission is performed in 1:1 correspondence.

Incidentally, as an alternative to the case where only one memory unit is selected to receive signals, a plurality of memory units may receive the same signals simultaneously on the signal receiving side under the above bus arrangement.

Figure 8:
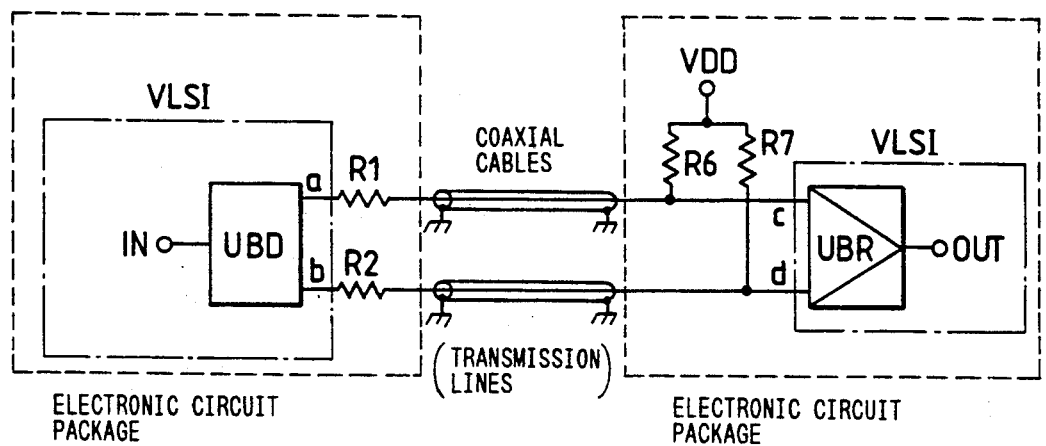
FIG. 8 is a circuit diagram illustrating a still further embodiment of each unit circuit comprising a pair of a signal transmission circuit and a signal receiving circuit which are employed in the digital signal processing apparatus to which the present invention is applied.

FIG. 8 is a circuit diagram illustrating a still further embodiment of unit circuits UBD, UDR each comprising a pair of a signal transmission circuit BD and a signal receiving circuit BR which are employed in the above digital signal processing apparatus.

In the present embodiment, coaxial cables are used as a pair of transmission lines. This arrangement is such that terminating resistors R6, R7 connected to their corresponding coaxial cables are provided and series resistors R1, R2 are inserted into signal transmission ends. When such cables are employed, signals can be transmitted over a widerband according to the transmission characteristics of the signals to be transmitted to the coaxial cables. Thus, since complementary signals each having small amplitude are supplied using such coaxial cables, the signals can be received accurately on the receiving side by a simple circuit such as a differential circuit without the need for a special reference voltage.

Any one of the above-described embodiments can be constructed such that a single source voltage is used as the operating voltage. As a consequence, the power circuit employed in the digital signal processing apparatus can be simplified.

The signal transmission system and its circuits, which have been described in detail according to the previous embodiments, are effective in an ATM exchanger used for an ISDN (Integrated Services Digital Network System). More specifically, the ISDN is adapted to combine data employed in a telephone set and a facsimile/personal computer and image information used in a television/telephone system and/or a television conference system into a single digital network for thereby providing centralized service. The study and development in the ATM exchanger have been promoted to construct such a digital network. Namely, the ATM as the exchange system for combining a wide-band ISDN and a narrow-band ISDN together has been developed to deal flexibly with media such as various rates described above. The ATM can realize different transmission rates by changing the number of transmissions per hour, of packets with short fixed length. A conventional STM performs multiplexing by inserting information to be transmitted into a periodically-assigned time zone (time slot). This control is simple but the minimum unit of the time slot is 64 Kbit/sec and the signal transmission rate of an integral multiple of the minimum unit can merely be set, thus causing lack of the flexibility. In addition, the efficiency in the use of the STM is poor because a predetermined band is occupied during a period in which a communication channel is being established, irrespective of whether information is substantially present or absent.

As a system for occupying transmission lines according to the amount of data of the channel without determining a time slot, may be an X.25 packet. However, the X.25 packet is based on processing a variable-length packet in software. Processing such as flow control is complex and the limitations are imposed on rendering its processing high-speed. The ATM is of a system closer to an ideal in which merits of both of the STM and the X.25 packet described above are combined together. The user can combine conventionally used interfaces which differ every media into one ATM interface.

The above-described ATM comprises complex systems in which electronic-circuit packaged functional blocks are mutually connected. In the VLSIs mounted in the electronic circuit packages, their processing has been rendered high-speed with development in semiconductor techniques. However, the signal transmission between the electronic circuit packages brings about a large neck. Since the signal transmission system and its circuits, which have been shown and described in the previous embodiment, can be rendered high-speed by a simple construction, they are suitable for the ATM exchanger comprising the above complex system arrangements.

Operation and effects obtained from the above embodiments are as follows:

(1) The complementary signals to be transmitted are outputted from the transmission side through the series resistors. The amplitude of each of the signals to be transmitted is reduced by the series resistors and the terminating resistors provided on the receiving side. In addition, the input signal having the amplitude thus reduced is amplified by the differential amplifying circuit having the high input impedance, which is provided on the receiving side. This signal transmission system can bring about an advantageous effect that since the level of each of the signals transmitted to the transmission lines is brought into small amplitude formed by the voltage or potential division based on the series resistors on the transmission side and the terminating resistors on the receiving side, the signal transmission can be performed at high speed even when the CMOS circuit having a small drive current and drive ability alone and the like are employed.

(2) Since the noise enters, in the common mode, the transmission lines in the form of a twisted pair for transmitting the complementary signals, this system can also bring about an effect in that the noise can be canceled by the differential amplifying circuit on the receiving side in accordance with the above item (1).

(3) The signal transmission system described in the above item (1) can bring about an advantageous effect in that a high-speed signal transmission circuit can be realized by the arrangement on the signal transmission side, which can comprise the output circuit for outputting the complementary output signals therefrom in response to the signals to be transmitted and resistor means connected in series to its output terminals respectively, and by the simple arrangement on the signal receiving side, which comprises the terminating resistors provided at the terminals of the transmission lines, whose resistances being matched with the characteristic impedances thereof, and the differential amplifying circuit having the high input impedance.

(4) In the transmission circuit described in the above item (3), the drive current can also be reduced with a decrease in the amplitude of each of the signals. As a consequence, the circuit can bring about an advantageous effect in that the power consumption can be reduced while using a circuit permitting the high integration as in the CMOS circuit.

(5) The signal transmission system and its circuits described in the above item (1) can obtain an advantageous effect in that the simplification of the power circuit can be achieved because the source voltage can be formed as one.

(6) Since the above circuits are structurally simple and have low power consumption, the unit circuits on the signal transmission side and on the receiving side can make use of the input/output interface circuits used with the gate arrays, standard cells, etc., the interface circuit being employed in a so-called ASIC, for example. Therefore, the semiconductor integrated circuit device VLSI in which the signal transmission circuit and the signal receiving circuit are mounted can easily be designed and fabricated.

A description has specifically been made of the invention made by the present inventor based on the embodiments as mentioned above. However, the present invention is not necessarily limited to the previous embodiments. It is needless to say that many changes and modifications can be made without departing from the spirit or scope of the invention as set forth herein. Where it is desired to dispose the terminating resistors in the source voltage side as in the output circuits shown in FIGS. 1 and 3, the output MOSFETs Q1, Q3 for forming the output signals on the source voltage side and the like may be omitted from the output circuits. Namely, the high level of each signal to be transmitted can be determined by the terminating resistors in the signal transmission system according to the present invention. Therefore, the output circuit of the open-drain arrangement comprising the output MOSFETs Q2, Q4, from which the above output MOSFETs Q1, Q4 have been excluded, may be used. At this case, the inverter circuits corresponding to this arrangement may also be omitted.

Incidentally, the terminating resistors may be provided on either the source voltage side or the ground potential side of the other circuit. At this case, the output signal having the high level is substantially subjected to the voltage division by the series resistors and the terminating resistors and then transmitted to the receiving side.

The output circuits provided in the signal transmission circuit in the semiconductor integrated circuit device, the inner circuit thereof and the input circuits in the signal receiving circuit can be used with various forms such as those composed of the CMOS circuit and the N-channel MOSFET or the P-channel MOSFET, the combination of the MOSFET and bipolar type transistor or those constructed by the bipolar type transistors. In addition, as the input circuits in the signal receiving circuit, those using the high input impedance as in those using junction FETs or the like, as well as those using the MOSFET may be adopted. A specific construction of the level shifting circuit can be used with various forms such as diodes, and MOSFETs constructed in the form of diodes.

The present invention can widely be used in the digital signal processing apparatus comprising the electronic circuit packages as a plurality of mounting substrates, in which the transfer of the signals are performed, as well as employed in the ATM exchanger for the ISDN.

A simple description will now be made of advantageous effects obtained by typical one out of the inventions disclosed in the present application. They are as follows. Namely, the complementary signals to be transmitted are outputted from the transmission side via the series resistors. Then, the amplitude of each of the signals to be transmitted is reduced by the series resistors and the terminating resistors on the receiving side. The input signals having the amplitude thus reduced are amplified by the differential amplifying circuit having the high input impedance provided on the receiving side. As a consequence, the level of each of the signals conveyed to the transmission lines is brought into a small amplitude by the resistive voltage division using the series resistors on the transmission side and the terminating resistors on the receiving side. Therefore, the signal transmission can be effected at high speed even in the case of the output circuits using the MOSFET having low current drive ability as in the CMOS circuit having small drive current and drive ability alone and the like. In addition, since the noise enters, in the common mode, the transmission lines of a twisted pair for transmitting the complementary signals, the noise can be canceled by the differential amplifying circuit provided on the receiving side. The high-speed signal transmission circuit can be realized by the arrangement on the signal transmission side, which can comprise the output circuit for outputting the complementary output signals therefrom in response to the signals to be transmitted and resistor means connected in series to the output terminals of the output circuit, respectively, and by the simple arrangement on the signal receiving circuit side, which comprises the terminating resistors provided at the terminals of the transmission lines, whose resistances being matched with the characteristic impedances thereof, and the differential amplifying circuit having the high input impedance.

What is claimed is:

1. A signal transmission circuit comprising:

a transmission-side output circuit for outputting complementary output signals therefrom in response to signals to be transmitted;
resistor means connected in series to output terminals, respectively, of said output circuit;
terminating resistors whose resistances are adapted to be matched with the characteristic impedances of transmission lines for transmitting the complementary output signals; and
a receiving input circuit, having an input portion, a level shifting circuit connected to said input portion for level shifting an input signal, and a high-input impedance type differential amplifying circuit connected to said level shifting circuit, said receiving input circuit being used to receive the output signals transmitted from said output circuit.

2. A signal transmission circuit comprising:
a plurality of transmission-side circuits and receiving-side circuits; and
transmission lines provided in common to the respective circuits and provided, at both ends thereof, with terminating resistors whose resistances are matched with the characteristic impedances thereof;
whereby one transmission-side circuit and one or more receiving-side circuits are selected to thereby transmit signals through said transmission lines, and the transmission-side circuit thus selected serves to deliver output signals via series resistors having resistance values larger than those of the terminating resistors to said selected one or more receiving circuits, wherein said one or more selected receiving circuits amplify the received output signals by a high-input impedance type differential amplifying circuit.

3. A signal transmission system comprising:
a transmission-side output circuit having output terminals for outputting complementary output signals derived from signals to be transmitted;
resistor means coupled in series to said output terminals, respectively, of said output circuit;
an input circuit having first and second input terminals for receiving the output signals transmitted from said output circuit, a high-input impedance differential amplifying circuit connected to said input terminals;
a first terminating resistor coupled between said first input terminal of said input circuit and a power source voltage; and
a second terminating resistor coupled between said second input terminal of said input circuit and said power source voltage, wherein said resistor means coupled in series to said output terminals respectively, have predetermined resistance values larger than those of said first or second terminating resistor.

4. A signal transmission system according to claim 3, further comprising a third terminating resistor coupled between said first and second input terminals o said input circuit, wherein resistances of said first, second and third terminating resistors are matched with the characteristic impedances of transmission lines for transmitting the complementary output signals.

5. A signal transmission circuit according to claim 1, wherein said transmission-side output circuit includes MOSFETs.

6. A signal transmission circuit according to claim 1, wherein said transmission-side output circuit includes a first MOSFET coupled between a first power source voltage and a first output terminal of said output circuit and a second MOSFET coupled between a second power source voltage and said first MOSFET, and wherein said first and second MOSFETs are driven complimentarily.

7. A signal transmission circuit according to claim 6, wherein said transmission-side output circuit includes a third MOSFET coupled between said first power source voltage and a second of said output terminals of said output circuit and a fourth MOSFET coupled between said second power source voltage and said third MOSFET, and wherein said third and fourth MOSFETs are driven complimentarily.

8. A signal transmission circuit according to claim 7, wherein said first and third MOSFETs are driven complimentarily, and wherein said second and fourth MOSFETs are driven complimentarily.

9. A signal transmission circuit according to claim 5, wherein said level shifting circuit comprises a first MOSFET having a gate coupled to one of said transmission lines and a second MOSFET having a gate coupled to another of said transmission lines.

10. A signal transmission circuit according to claim 9, wherein said transmission-side output circuit is formed in a first integrated circuit, and wherein said receiving input circuit is formed in a second integrated circuit.

11. A signal transmission circuit comprising:
a transmission-side output circuit for outputting, over transmission lines, complementary output signals derived from signals to be transmitted;
resistor means coupled in series to output terminals, respectively, of said output circuit;
terminating resistors connected to said transmission lines for transmitting the complementary output signals having resistances which are matched with characteristic impedances of said transmission lines; and
an input circuit having a high-input impedance differential amplifying circuit which receives output signals transmitted from said output circuit, wherein said resistor means coupled in series to output terminals have predetermined resistance values larger than those of said terminating resistors.

12. A signal transmission circuit according to claim 11, wherein said transmission-side output circuit is formed in a first integrated circuit, and wherein said input circuit is formed in a second integrated circuit.

13. A signal transmission circuit according to claim 1, wherein said transmission-side output circuit is formed in a first integrated circuit, and wherein said receiving input circuit is formed in a second integrated circuit.

14. A signal transmission circuit according to claim 13, wherein said terminating resistors are formed on said second integrated circuit.

15. A signal transmission circuit, comprising:
an integrated transmission-side output circuit for outputting complementary signals therefrom in response to signals to be transmitted;
transmission lines connected to said output circuit; and
an integrated receiving input circuit having an input portion for receiving complementary signals outputted by said output circuit over said transmission lines, a level shifting circuit connected to said input portion for shifting a level of complementary signals input by said input portion, an amplifying circuit connected to said level shifting circuit for amplifying complementary signals output from said level shifting circuit whose voltage level has been shifted to a range which can be amplified by said amplifying circuit, wherein active components of said output circuit and said receiving input circuit are MOSFETs.

16. A signal transmission circuit, comprising:
a reference ground;
a transmission-side output circuit for outputting complementary signals therefrom in response to signals to be transmitted;
a receiving input circuit having an input portion, and an amplifying circuit connected to said input portion;
transmission lines connected between said transmission side output circuit and said input portion of said receiving input circuit; and
terminating resistor means connected between at least one of said transmission lines and a voltage source whose voltage is different from said reference ground.

17. A signal transmission circuit according to claim 16, wherein said transmission side output circuit is an integrated circuit and said receiving input circuit is an integrated circuit, active components of said transmission-side output circuit and said receiving input circuit are MOSFETs, wherein series resistors are connected between said transmission side output circuit and said transmission lines, said series resistors for reducing a voltage of complementary output signals transmitted from said transmission-side output circuit.

18. A signal transmission circuit according to claim 17, wherein said terminating resistor means raises a voltage level of signals transmitted over said transmission lines towards a voltage of said voltage source.

19. A signal transmission circuit according to claim 18, wherein said receiving input circuit further comprises a level shifting circuit for shifting a level of received complementary signals whose voltage has been raised by said resistor means towards said reference ground such that level shifted signals have a voltage which can be amplified by said amplifying circuit.

20. A signal transmission circuit according to claim 19, wherein the resistances of said series resistors are greater than the resistance of said terminating resistor means.

21. A signal transmission circuit according to claim 19, wherein said amplifying circuit comprises CMOS circuitry.

22. A signal transmission circuit according to claim 19, further comprising a switching circuit for deactivating said receiving input circuit in response to a deactivation signal.

23. A signal transmission circuit according to claim 22, wherein said receiving circuit has an output portion connected to said differential amplifying circuit and wherein said switching circuit comprises means for preventing a signal from flowing said output portion of said receiving input circuit.

24. A signal transmission circuit according to claim 23, wherein said switching circuit deactivates said level shifting circuit and said amplifying circuit, and said means for preventing a signal from flowing prevents a DC signal from flowing to said output portion of said receiving input circuit.

* * * * *